(12) United States Patent
Huang

(10) Patent No.: US 12,255,760 B2
(45) Date of Patent: Mar. 18, 2025

(54) ELECTRONIC DEVICE WITH CABLE INTERFACE AND MANUFACTURING METHOD THEREOF

(71) Applicant: HTC Corporation, Taoyuan (TW)

(72) Inventor: Shih-Nien Huang, Taoyuan (TW)

(73) Assignee: HTC Corporation, Taoyuan (TW)

( * ) Notice: Subject to any disclaimer, the term of this patent is extended or adjusted under 35 U.S.C. 154(b) by 419 days.

(21) Appl. No.: 17/805,865

(22) Filed: Jun. 8, 2022

(65) Prior Publication Data
US 2023/0402793 A1    Dec. 14, 2023

(51) Int. Cl.
H04L 25/08    (2006.01)

(52) U.S. Cl.
CPC .................. *H04L 25/085* (2013.01)

(58) Field of Classification Search
CPC ..................................... H04L 25/085
USPC ......................................... 327/100
See application file for complete search history.

(56) References Cited

U.S. PATENT DOCUMENTS

| 8,246,386 B1 | 8/2012 | DeVito et al. | |
| 2016/0308683 A1* | 10/2016 | Pischl | H04L 12/10 |

FOREIGN PATENT DOCUMENTS

| CN | 109565296 A | 4/2019 |
| TW | 201427274 A | 7/2014 |
| TW | 201810992 A | 3/2018 |
| WO | 2015/034684 A1 | 3/2015 |

OTHER PUBLICATIONS

The office action of the corresponding Taiwanese application No. TW111121318 issued on Feb. 22, 2024.
The Office Action of corresponding TW111121318 issued on Mar. 10, 2023.

* cited by examiner

*Primary Examiner* — Tomi Skibinski
(74) *Attorney, Agent, or Firm* — CKC & Partners Co., LLC

(57) ABSTRACT

An electronic device includes a printed circuit board, an integrated circuit, a connector, a choke module and a compensation module. The integrated circuit is disposed on the printed circuit board. The connector is disposed on the printed circuit board. The choke module is disposed on the printed circuit board and coupled between the integrated circuit and the connector. The compensation module is disposed on the printed circuit board and coupled between the choke module and the connector.

18 Claims, 7 Drawing Sheets

ELECTRONIC DEVICE WITH CABLE INTERFACE AND MANUFACTURING METHOD THEREOF

BACKGROUND

Field of Invention

The disclosure relates to an electronic device with a cable interface. More particularly, the disclosure relates to the electronic device capable of reducing a common mode noise on the cable interface.

Description of Related Art

For an electronic product with communication functions, the digital electronic products often include an antenna circuit and also a high-speed connector interface, such as a Universal Serial Bus (USB) port, a High Definition Multimedia Interface (HDMI) port or a display port.

A designer of the electronic product will have to solve a radio frequency interference (RFI) issue and/or electromagnetic interference (EMI) issue between the antenna circuit and the high-speed connector interface on the electronic product. A modern design of the electronic product is usually formed in a compact size. Therefore, in some cases, the antenna circuit and the high-speed connector in the electronic product are forced to locate close to each other. It will be more challenging to reduce the radio frequency interference and the electromagnetic interference.

SUMMARY

The disclosure provides an electronic device, which includes a printed circuit board, an integrated circuit, a connector, a choke module and a compensation module. The integrated circuit is disposed on the printed circuit board. The connector is disposed on the printed circuit board. The choke module is disposed on the printed circuit board and coupled between the integrated circuit and the connector. The compensation module is disposed on the printed circuit board and coupled between the choke module and the connector.

The disclosure also provides a manufacturing method for manufacturing an electronic device. The manufacturing method includes following steps. A printed circuit board is provided and the printed circuit board includes a first layout wiring and a second layout wiring. An integrated circuit is attached on the printed circuit board, and the integrated circuit is connected with the first layout wiring and the second layout wiring. A connector is attached on the printed circuit board, and the connector is connected with the first layout wiring and the second layout wiring. A choke module is attached on the printed circuit board between the integrated circuit and the connector, and the choke module is connected with the first layout wiring and the second layout wiring. A compensation module is attached on the printed circuit board between the choke module and the connector, and the compensation module is connected with the first layout wiring and the second layout wiring.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
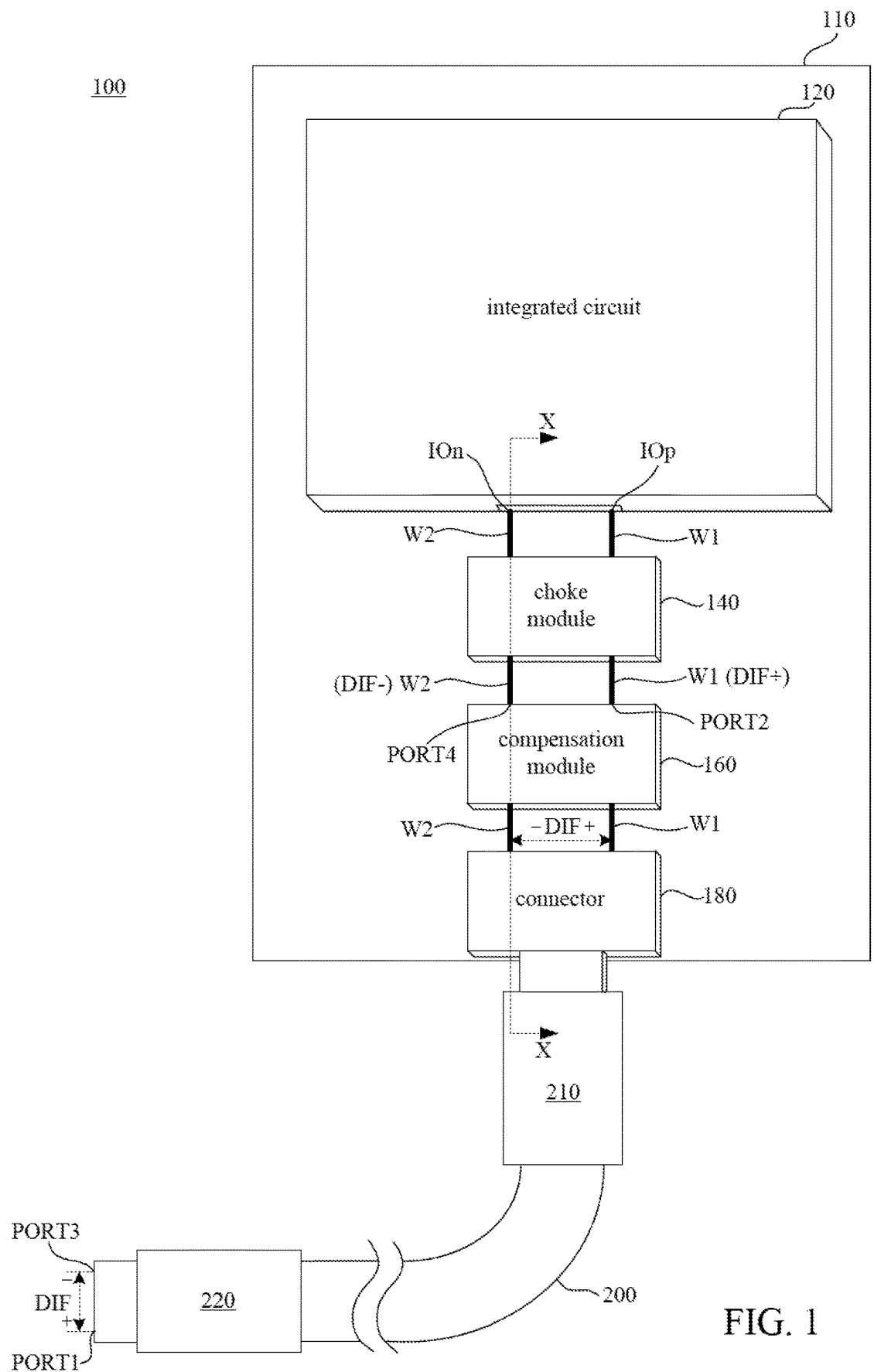
FIG. 1 is a schematic diagram illustrating a top view of an electronic device according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1, which is a schematic diagram illustrating a top view of an electronic device 100 according to some embodiments of the disclosure. As shown in FIG. 1, the electronic device 100 includes a printed circuit board 110, an integrated circuit (IC) 120, a choke module 140, a compensation module 160 and a connector 180. The integrated circuit 120, the choke module 140, the compensation module 160 and the connector 180 are disposed on a surface on the printed circuit board 110.

In some embodiments, the connector 180 is configured to connect with a first end 210 of a cable 200. The cable 200 is configured to carry differential signals DIF. The connector 180 connected with the cable 200 is configured to receive the differential signals DIF from the cable 200, or configured to transmit the differential signals DIF generated by the electronic device 100 to the cable 200.

According to an example, the connector 180 is a Universal Serial Bus (USB) connector; the cable 200 is a USB cable connected with the USB connector; and the differential signals DIF include digital data (e.g., files, documents, commands, instructions or packages) suitable to be transmitted over the USB cable. According to another example, the connector 180 is a High Definition Multimedia Interface (HDMI) connector; the cable 200 is a HDMI cable connected with the HDMI connector; and the differential signals DIF include display information (e.g., images, videos, frames or streaming flows).

As shown in FIG. 1, the printed circuit board includes a first layout wiring W1 and a second layout wiring W2, which are coupled between the integrated circuit 120 and the connector 180. The first layout wiring W1 and a second layout wiring W2 are configured to transmit the differential signals DIF between the integrated circuit 120 and the connector 180 (and further to the cable 200).

In some embodiments, the first layout wiring W1 is configured to transmit a positive signal DIF+ of the differential signals DIF between the integrated circuit 120 and the cable 200. In some embodiments, the second layout wiring W2 is configured to transmit a negative signal DIF- of the differential signals DIF between the integrated circuit 120 and the cable 200.

In some embodiments, the differential signals DIF are inward signals inputted from the cable 200 into the integrated circuit 120 of the electronic device 100. In this case, the integrated circuit 120 is configured to receive the differential signals DIF through the choke module 140, the compensation module 160 and the connector 180 from the cable 200.

In some embodiments, the differential signals DIF are outward signals generated by the electronic device 100 and transmitted to the cable 200. In this case, the integrated circuit 120 is configured to generate the differential signals DIF, and the differential signals DIF are transmitted from the integrated circuit 120, through the choke module 140, the compensation module 160 and the connector 180 to the cable 200. In some embodiments, the differential signals DIF generated by the integrated circuit 120 of the electronic device 100 can be transmitted through the cable 200 to an external device (e.g., a computer, a monitor or a television, not shown in figure) coupled with a second end 220 of the cable 200.

Figure 2:
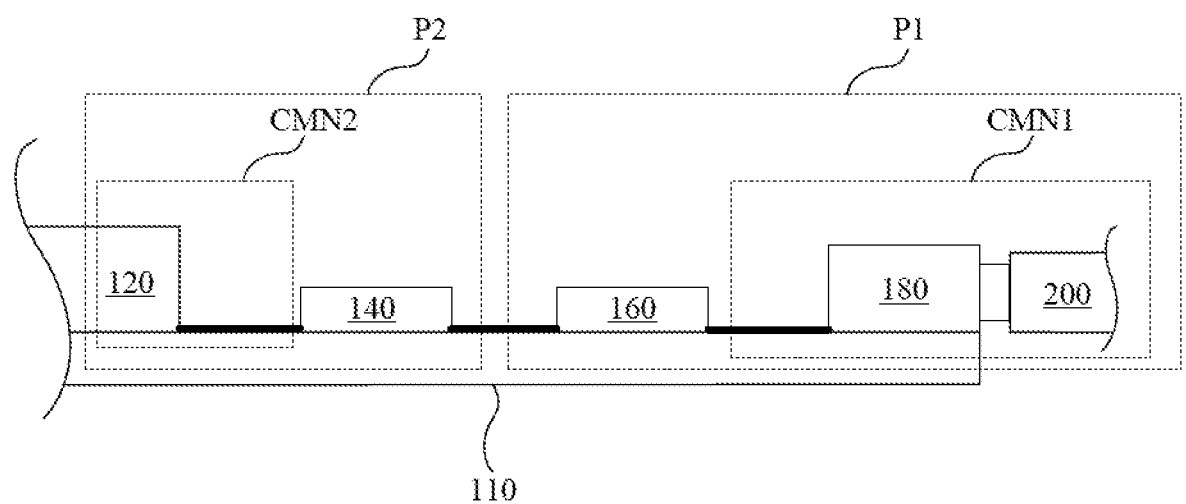
FIG. 2 is a sectional view diagram illustrating the electronic device in FIG. 1 along a sectional line according to some embodiments.

Reference is further made to FIG. 2, which is a sectional view diagram illustrating the electronic device 100 in FIG. 1 along a sectional line X-X according to some embodiments.

As shown in FIG. 1 and FIG. 2, while transmitting the differential signal DIF along the cable 200 and the connector 180, the differential signals DIF transmitted through the cable 200 may induce a first common mode noise CMN1 accumulated on the connection pins of the connector 180, because connection pins on the connector 180 (connecting with the cable 200) may have mismatched impedances and/or refer to inconsistent ground levels. In other words, the first common mode noise CMN1 is induced by a differential to common mode conversion of the differential signals DIF. This first common mode noise CMN1 may interfere with other components (e.g., an antenna or a radio frequency circuit, not shown in figures) disposed around the connector 180 on the printed circuit board 110.

In some practical cases, the first common mode noise CMN1 accumulated on the connection pins of the connector may induce a current. The induced current may flow on a shielding surface of the connector and the cable, which may cause a noise radiation interfering with other components (e.g., an antenna or a radio frequency circuit, not shown in figures). The noise radiation cannot be ignored. In some examples, when the electronic device 100 (e.g., a mobile phone or a laptop computer) is connected with a USB cable, the noise radiation caused by the USB cable may interfere with a wireless mouse connected with the electronic device 100, or cause a degradation on a wireless network throughput on the electronic device 100. Similar noise radiation programs will also happen when the electronic device 100 is connected with other signal cables, such as a Peripheral Component Interconnect Express (PCIE) cable, a Serial Advanced Technology Attachment (SATA) cable, a High Definition Multimedia Interface (HDMI) cable, a Display Port (DP) cable, a Digital Visual Interface (DVI) cable or a Video Graphics Array (VGA) cable.

In some cases, as shown in FIG. 1 and FIG. 2, an imbalance may exist between a positive input/output terminal IOp of the integrated circuit 120 and a negative input/output terminal IOn of the integrated circuit. In an example, a positive signal driving circuit (not shown in figures) of the integrated circuit 120 has a driving power different from a negative signal driving circuit (not shown in figures) of the integrated circuit 120, and this difference may cause the imbalance and further to induce a second common mode noise CMN2. In another example, an impedance of the first layout wiring W1 may be different from an impedance of the second layout wiring W2, and it may also cause the imbalance and further to induce the second common mode noise CMN2. While the integrated circuit 120 generates (or receives) the different signal, the second common mode noise CMN2 may accumulate on the positive input/output terminal IOp and the negative input/output terminal IOn of the integrated circuit 120.

As shown in FIG. 1 and FIG. 2, the choke module 140 is disposed on the printed circuit board 110 and is coupled between the integrated circuit 120 and the connector 180. To be more specific, in some embodiments, the choke module 140 is coupled between the integrated circuit 120 and the compensation module 160. In some embodiments, the choke module 140 is connected with the first layout wiring W1 and the second layout wiring W2, and is located adjacent to the integrated circuit 120. The choke module 140 in some embodiments includes a common mode choke coil, which is configured to compensate or reduce the second common mode noise CMN2 accumulated on the positive input/output terminal IOp and the negative input/output terminal IOn of the integrated circuit 120.

In some embodiments, the common mode choke coil (the choke module 140) is implemented adjacent to the integrated circuit 120, and is able to be designed as a noise filter to compensate or reduce the second common mode noise CMN2 in a second portion P2 (including the integrated circuit 120 and the choke module 140) as shown in FIG. 1. In some embodiments, the choke module 140 is not able to compensate or reduce the first common mode noise CMN1 in a first portion P1 (including the compensation module 160, the connector 180 and the cable 200), because the choke module 140 is relatively far from the connector 180 and also the cable 200 is normally not considered in the design of the choke module 140.

As shown in FIG. 1 and FIG. 2, the compensation module 160 is disposed on the printed circuit board 110 and is coupled between the choke module 140 and the connector 180. In some embodiments, the compensation module 160 is configured to compensate or reduce the first common mode noise CMN1 on the connector in the first portion P1. In some embodiments, the compensation module 160 is configured to reduce a scattering parameter (S-parameter) of differential to common mode conversion (SCD21) of the whole first portion P1, which include the compensation module 160, the connector 180 and the cable 200. Further details about how the compensation module 160 reduces the S-parameter of differential to common mode conversion (SCD21) will be discussed below.

Reference are further made to FIG. 3A to FIG. 3E, which are schematic diagrams illustrating different configurations of the compensation modules 160a-160e according to some embodiments. Each of the compensation modules 160a-160e can be utilized to implement the compensation module shown in FIG. 1 and FIG. 2.

Figure 3A:
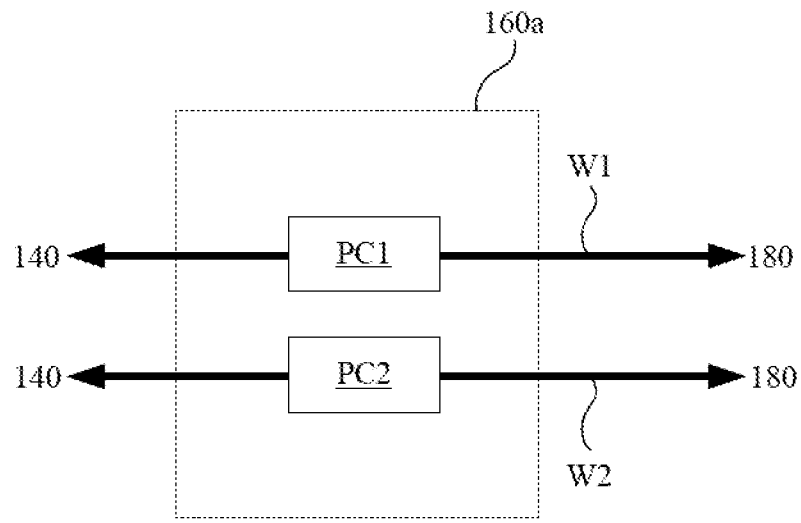
FIG. 3A to FIG. 3E are schematic diagrams illustrating different configurations of the compensation modules according to some embodiments.

As shown in FIG. 3A, the compensation module 160a includes a first passive component PC1 and a second passive component PC2. The first passive component PC1 is coupled in series with the first layout wiring W1 between the choke module 140 and the connector 180. The second passive component PC2 is coupled in series with the second layout wiring W2 between the choke module 140 and the connector 180. Each of the first passive component PC1 and second passive component PC2 can include at least one of a resistor (R), an inductor (L) and a capacitor (C).

Figure 3B:
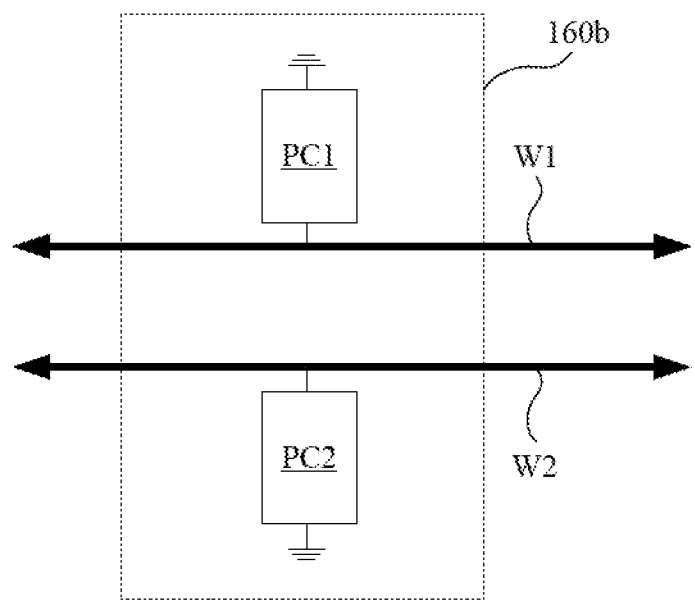

As shown in FIG. 3B, the compensation module 160b includes a first passive component PC1 and a second passive component PC2. A first terminal of the first passive component PC1 is coupled to the first layout wiring W1 between the choke module 140 and the connector 180, and a second terminal of the first passive component PC1 is grounded. A first terminal of the second passive component PC2 is coupled to the second layout wiring W2 between the choke module 140 and the connector 180, and a second terminal of the second passive component PC2 is grounded. Each of the first passive component PC1 and second passive component PC2 can include at least one of a resistor (R), an inductor (L) and a capacitor (C).

Figure 3C:
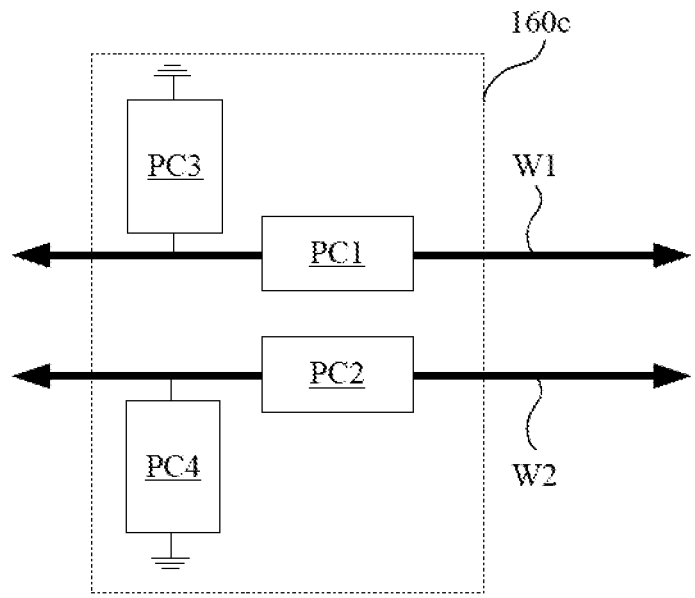

As shown in FIG. 3C, the compensation module 160c includes a first passive component PC1, a second passive component PC2, a third passive component PC3 and a fourth passive component PC4. The first passive component PC1 is coupled in series with the first layout wiring W1 between the choke module 140 and the connector 180. The second passive component PC2 is coupled in series with the second layout wiring W2 between the choke module 140 and the connector 180. A first terminal of the third passive component PC3 is coupled to the first layout wiring W1 between the choke module 140 and the first passive component PC1, and a second terminal of the third passive component PC3 is grounded. A first terminal of the fourth passive component PC4 is coupled to the second layout wiring W2 between the choke module 140 and the second passive component PC2, and a second terminal of the fourth passive component PC4 is grounded. Each of the first passive component PC1, the second passive component PC2, the third passive component PC3 and the fourth passive component PC4 can include at least one of a resistor (R), an inductor (L) and a capacitor (C).

Figure 3D:
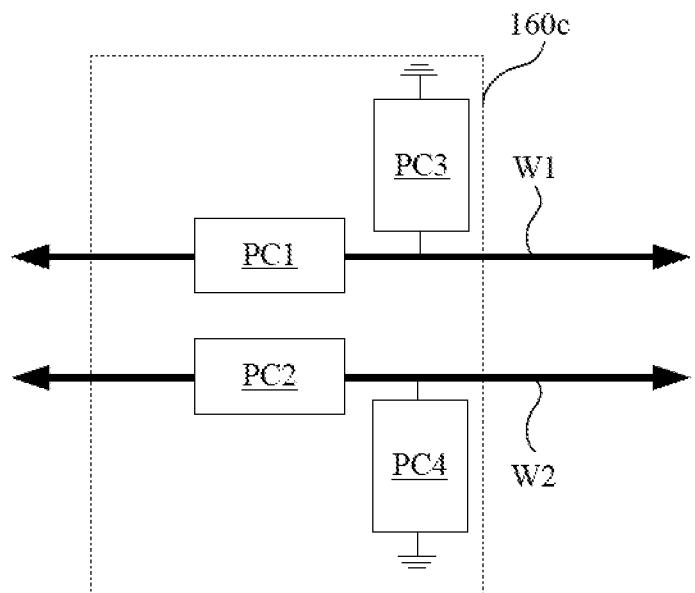

As shown in FIG. 3D, the compensation module 160d includes a first passive component PC1, a second passive component PC2, a third passive component PC3 and a fourth passive component PC4. Compared to FIG. 3C, in the embodiments shown in FIG. 3D, a first terminal of the third passive component PC3 is coupled to the first layout wiring W1 between the first passive component PC1 and the connector 180. A first terminal of the fourth passive component PC4 is coupled to the second layout wiring W2 between the second passive component PC2 and the connector 180. Other structural features of the compensation module 160d shown in FIG. 3D are similar to the compensation module 160c shown in FIG. 3C.

Figure 3E:
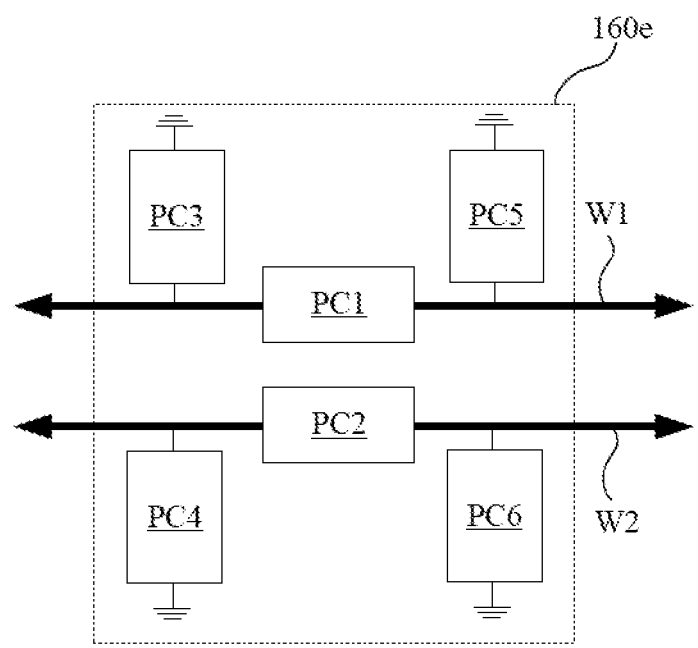

As shown in FIG. 3E, the compensation module 160d includes a first passive component PC1, a second passive component PC2, a third passive component PC3, a fourth passive component PC4, a fifth passive component PC5 and a sixth passive component PC6. Compared to FIG. 3C, in the embodiments shown in FIG. 3E, the fifth passive component PC5 and the sixth passive component PC6 are added. A first terminal of the fifth passive component PC5 is coupled to the first layout wiring W1 between the first passive component PC1 and the connector 180. A first terminal of the sixth passive component PC6 is coupled to the second layout wiring W2 between the second passive component PC2 and the connector 180. The third passive component PC3 and the fifth passive component PC5 are coupled to different terminals of the first passive component PC1. The fourth passive component PC4 and the sixth passive component PC6 are coupled to different terminals of the second passive component PC2. Other structural features of the compensation module 160e shown in FIG. 3E are similar to the compensation module 160c shown in FIG. 3C.

It is noticed that one of the compensation modules 160a-160e in FIG. 3A to FIG. 3E can be selected and utilized as the compensation module 160 in the embodiments shown in FIG. 1 and FIG. 2. The selection between the different configurations of the compensation modules 160a~160e and values of the resistor (R), the inductor (L) or the capacitor (C) of the passive components thereof can be designed according to a S-parameter measurement relative to the first portion P1 in FIG. 2.

Figure 4:
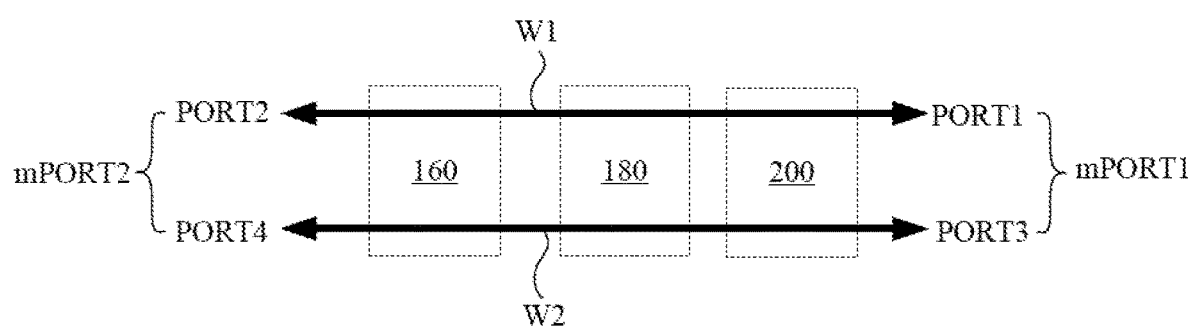
FIG. 4 is a schematic diagram illustrating a port definition about the compensation module, the connector and the cable in the S-parameter measurement.

Reference is further made to FIG. 4, which is a schematic diagram illustrating a port definition about the compensation module 160, the connector 180 and the cable 200 in the S-parameter measurement.

As shown in FIG. 1 and FIG. 4, a connection port PORT1 is defined on cable 200 corresponding to the positive signal DIF+ and the first layout wiring W1, and another connection port PORT3 is defined on cable 200 corresponding to the negative signal DIF− and the second layout wiring W2. A connection port PORT2 is defined on the compensation module 160 and coupled to the first layout wiring W1 (toward the choke module 140) corresponding to the positive signal DIF+. Another connection port PORT4 is defined on the compensation module 160 and coupled to the second layout wiring W2 (toward the choke module 140) corresponding to the negative signal DIF−.

Aforesaid four connection ports PORT1-PORT4 can be connected to a network analyzer to performed scattering parameter (S-parameter) analyzation in a 4-ports single-end mode. The S-parameter analyzation will generate a single-end S-parameter matrix as below:

$$\begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix}$$

In the single-end S-parameter matrix, the S-parameter $S_{XY}$ represents a response level on the connection port PORTX when a stimulus is triggered at the connection port PORTY. For example, the S-parameter $S_{12}$ represents a response on the connection port PORT1 when a stimulus is triggered at the connection port PORT2; the S-parameter $S_{23}$ represents a response on the connection port PORT2 when a stimulus is triggered at the connection port PORT3; the S-parameter $S_{11}$ represents a response on the connection port PORT1 when a stimulus is triggered at the connection port PORT1. The single-end S-parameter matrix are commonly used to analyze a pair of coupled transmission lines to determine the amount of cross-talk between them, if they are driven by two separate single ended signals, or the reflected and incident power of a differential signal driven across them.

In some embodiments, as shown in FIG. 4, the connection ports PORT1 and PORT3 together can be defined as a logic-port mPORT1, and the connection ports PORT2 and PORT4 together can be defined as a logic-port mPORT2. The single-end S-parameter matrix can be converted into a mixed-mode S-parameters matrix as below:

$$\begin{pmatrix} S_{DD11} & S_{DD12} & S_{DC11} & S_{DC12} \\ S_{DD21} & S_{DD22} & S_{DC21} & S_{DC22} \\ S_{CD11} & S_{CD12} & S_{CC11} & S_{CC12} \\ S_{CD21} & S_{CD22} & S_{CC21} & S_{CC22} \end{pmatrix}$$

In the mixed-mode S-parameter matrix, the S-parameter $S_{CD21}$ represents a common-mode response on the connection port mPORT2 when a differential-mode stimulus is triggered at the connection port mPORT1. In other words, the S-parameter $S_{CD21}$ indicates the differential to common mode conversion of the differential signals DIF transmitted over the cable 200 onto the connection port mPORT2 (i.e., the connection ports PORT2 and PORT4 on the compensation module 160).

In some embodiments, the S-parameter $S_{CD21}$ in the mixed-mode S-parameter matrix can be calculated based on the single-end S-parameter matrix as:

$$S_{CD21}=(S_{21}+S_{41}-S_{23}-S_{43})/2$$

Similarly, other S-parameters in the mixed-mode S-parameter matrix can be calculated based on S-parameters in the single-end S-parameter matrix.

In some embodiments, after the S-parameter analyzation to the four connection ports PORT1-PORT4, the S-parameter $S_{CD21}$ can be measured and monitored. The compensation module 160 is adjusted (by selecting different configurations shown in FIG. 3A to FIG. 3E, or by changing the values of the resistor (R), the inductor (L) or the capacitor (C) of the passive components) to reduce or minimize the S-parameter $S_{CD21}$ obtained in the mixed-mode S-parameters matrix.

After selecting an optimal configuration of the compensation module 160, the compensation module 160 will be able to reduce or minimize the S-parameter $S_{CD21}$ of the whole first portion P1 (including the compensation module 160, the connector 180 and the cable 200). In this case, the compensation module 160 is able to reduce the first common mode noise CMN1 on the connector 180.

Figure 5:
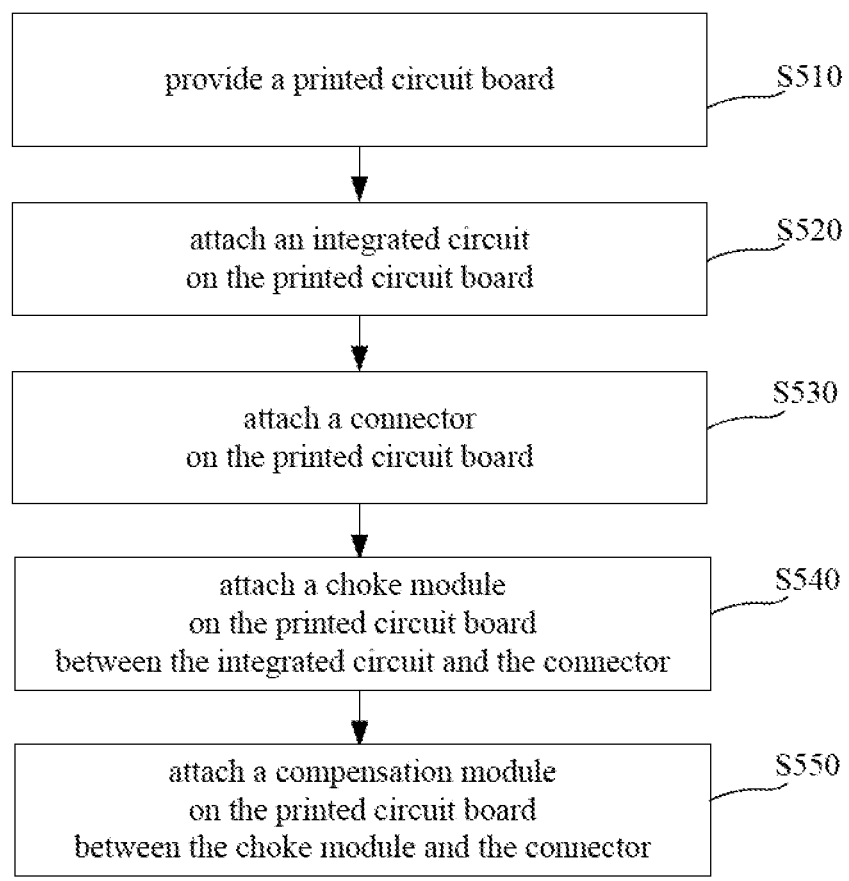
FIG. 5 is a flow chart diagram illustrating a manufacturing method according to some embodiments of the disclosure.

Reference is further made to FIG. 5, which is a flow chart diagram illustrating a manufacturing method 500 according to some embodiments of the disclosure. The manufacturing method 500 is configured to produce an electronic device 100 discussed in aforesaid embodiments shown in FIG. 1 and FIG. 2. As shown in FIG. 1, FIG. 2 and FIG. 5, step S510 is executed to provide a printed circuit board 110. The printed circuit board 110 includes a first layout wiring W1 and a second layout wiring W2. Step S520 is executed, by a bonding machine and/or a welding machine, to attach an integrated circuit 120 on the printed circuit board 110, and connect the integrated circuit 120 with the first layout wiring W1 and the second layout wiring W2. Step S530 is executed, by the bonding machine and/or the welding machine, to attach a connector 180 on the printed circuit board 110, and connect the connector 180 with the first layout wiring W1 and the second layout wiring W2. Step S540 is executed, by the bonding machine and/or the welding machine, to attach a choke module 140 on the printed circuit board 110 between the integrated circuit 120 and the connector 180, and connect the choke module 140 with the first layout wiring W1 and the second layout wiring W2.

Step S550 is executed, by the bonding machine and/or the welding machine, to attach a compensation module 160 on the printed circuit board 110 between the choke module 140 and the connector 180, and connect the compensation module 160 with the first layout wiring W1 and the second layout wiring W2. The compensation module 160 implemented in step S550 can be one of the compensation modules 160a~160e discussed in aforesaid embodiments along with FIG. 3A to FIG. 3E. The configuration of the compensation module 160 and the values of the resistor (R), the inductor (L) or the capacitor (C) of the passive components within the compensation module 160 can be determined by the S-parameter analyzation as discussed in aforesaid embodiments, and not repeated here.

It is noticed that, the steps S520 to S550 are not limited to the order illustrated in FIG. 5. In some other embodiments, the steps S520 to S550 can be executed in an order different from the embodiment in FIG. 5.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic device, comprising:
   a printed circuit board;
   an integrated circuit, disposed on the printed circuit board;
   a connector, disposed on the printed circuit board;
   a choke module, disposed on the printed circuit board and coupled between the integrated circuit and the connector, wherein the choke module is configured to compensate or reduce a second common mode noise, the second common mode noise is induced by an imbalance between a positive input/output terminal of the integrated circuit and a negative input/output terminal of the integrated circuit; and
   a compensation module, disposed on the printed circuit board and coupled between the choke module and the connector.

2. The electronic device of claim 1, wherein the connector is configured to connect with a cable, the cable is configured to carry differential signals.

3. The electronic device of claim 2, wherein the integrated circuit is configured to generate the differential signals, the differential signals are transmitted from the integrated circuit, through the choke module and the compensation module, to the cable.

4. The electronic device of claim 2, wherein the integrated circuit is configured to receive the differential signals through the choke module and the compensation module from the cable.

5. The electronic device of claim 2, wherein the compensation module is configured to compensate or reduce a first common mode noise on the connector, the first common mode noise is induced by a differential to common mode conversion of the differential signals.

6. The electronic device of claim 1, wherein the printed circuit board comprises:
   a first layout wiring, configured to transmit a positive signal of differential signals between the integrated circuit and a cable; and
   a second layout wiring, configured to transmit a negative signal of the differential signals between the integrated circuit and the cable.

7. The electronic device of claim 6, wherein the compensation module comprises:
   a first passive component, coupled in series with the first layout wiring; and
   a second passive component, coupled in series with the second layout wiring.

8. The electronic device of claim 6, wherein the compensation module comprises:
   a first passive component, wherein a first terminal of the first passive component is coupled to the first layout wiring, and a second terminal of the first passive component is grounded; and a second passive component, wherein a first terminal of the second passive component is coupled to the second layout wiring, and a second terminal of the second passive component is grounded.

9. The electronic device of claim 6, wherein the compensation module comprises:
- a first passive component, coupled in series with the first layout wiring;
- a second passive component, coupled in series with the second layout wiring;
- a third passive component, wherein a first terminal of the third passive component is coupled to the first layout wiring, and a second terminal of the third passive component is grounded; and
- a fourth passive component, wherein a first terminal of the fourth passive component is coupled to the second layout wiring, and a second terminal of the fourth passive component is grounded.

10. The electronic device of claim 6, wherein the compensation module comprises:
- a first passive component, coupled in series with the first layout wiring;
- a second passive component, coupled in series with the second layout wiring;
- a third passive component, wherein a first terminal of the third passive component is coupled to the first layout wiring, and a second terminal of the third passive component is grounded;
- a fourth passive component, wherein a first terminal of the fourth passive component is coupled to the second layout wiring, and a second terminal of the fourth passive component is grounded;
- a fifth passive component, wherein a first terminal of the fifth passive component is coupled to the first layout wiring, and a second terminal of the fifth passive component is grounded, the third passive component and the fifth passive component are coupled to different terminals of the first passive component; and
- a sixth passive component, wherein a first terminal of the sixth passive component is coupled to the second layout wiring, and a second terminal of the sixth passive component is grounded, the fourth passive component and the sixth passive component are coupled to different terminals of the second passive component.

11. A manufacturing method, for manufacturing an electronic device, the manufacturing method comprising:
- providing a printed circuit board, the printed circuit board comprising a first layout wiring and a second layout wiring;
- attaching an integrated circuit on the printed circuit board, and connecting the integrated circuit with the first layout wiring and the second layout wiring;
- attaching a connector on the printed circuit board, and connecting the connector with the first layout wiring and the second layout wiring;
- attaching a choke module on the printed circuit board between the integrated circuit and the connector, and connecting the choke module with the first layout wiring and the second layout wiring, wherein the choke module is configured to compensate or reduce a second common mode noise, the second common mode noise is induced by an imbalance between a positive input/output terminal of the integrated circuit and a negative input/output terminal of the integrated circuit; and
- attaching a compensation module on the printed circuit board between the choke module and the connector, and connecting the compensation module with the first layout wiring and the second layout wiring.

12. The manufacturing method of claim 11, wherein the connector is configured to connect with a cable, the cable is configured to carry differential signals.

13. The manufacturing method of claim 12, wherein the integrated circuit is configured to generate the differential signals, the differential signals are transmitted from the integrated circuit, through the choke module and the compensation module, to the cable.

14. The manufacturing method of claim 12, wherein the integrated circuit is configured to receive the differential signals through the choke module and the compensation module from the cable.

15. The manufacturing method of claim 12, wherein the compensation module is configured to compensate or reduce a first common mode noise on the connector, the first common mode noise is induced by a differential to common mode conversion of the differential signals.

16. The manufacturing method of claim 11, wherein the first layout wiring is configured to transmit a positive signal of differential signals between the integrated circuit and a cable, the second layout wiring is configured to transmit a negative signal of the differential signals between the integrated circuit and the cable.

17. The manufacturing method of claim 11, wherein the compensation module comprises:
- at least one first passive component coupled with the first layout wiring; and
- at least one second passive component coupled with the first layout wiring.

18. The manufacturing method of claim 17, wherein the at least one first passive component and the at least one second passive component comprise a resistor, an inductor or a capacitor.

* * * * *